United States Patent
Chang et al.

(10) Patent No.: US 6,890,781 B2
(45) Date of Patent: May 10, 2005

(54) TRANSPARENT LAYER OF A LED DEVICE AND THE METHOD FOR GROWING THE SAME

(75) Inventors: Liann-Be Chang, Tao-Yuan (TW); Li-Hsin Kuo, Taipei (TW); Li-Zen Hsieh, Tu-Cheng (TW); Li-Yuan Chang, Chung-Ho (TW)

(73) Assignee: Uni Light Technology Inc., Tao-Yuan (TW)

( * ) Notice: Subject to any disclaimer, the term of this patent is extended or adjusted under 35 U.S.C. 154(b) by 113 days.

(21) Appl. No.: 10/178,366

(22) Filed: Jun. 25, 2002

(65) Prior Publication Data

US 2003/0234402 A1 Dec. 25, 2003

(51) Int. Cl.[7] ............................................... H01L 21/00
(52) U.S. Cl. ......................... 438/29; 438/492; 438/497
(58) Field of Search ........................... 438/29, 492, 497

(56) References Cited

U.S. PATENT DOCUMENTS 5,254,211 A * 10/1993 Yonehara ..................... 117/79

* cited by examiner

Primary Examiner—Sara Crane
(74) Attorney, Agent, or Firm—Rosenberg, Klein & Lee

(57) ABSTRACT

A transparent layer of a LED device and the method for growing the same are disclosed in this present invention. This present invention provides an improved liquid phase epitaxy (LPE) process for growing a transparent layer of a LED device. In the above-mentioned LPE process, an improved supersaturated solution is utilized to overcome the shortcomings in the prior art, wherein the supersaturated solution comprises antimony and/or indium as a solvent. Furthermore, a metallic zinc and/or magnesium dopant is added into the supersaturated solution to optimize the characters of the transparent layer. Therefore, this invention can provide a more efficient method for growing a transparent layer of a LED device, and the quality of the above-mentioned transparent layer can thereby be improved.

18 Claims, 1 Drawing Sheet

TRANSPARENT LAYER OF A LED DEVICE AND THE METHOD FOR GROWING THE SAME

BACKGROUND OF THE INVENTION

1. Field of the Invention

This present invention relates to a transparent layer and the method for growing the same, and more particularly to a transparent layer and an improved liquid phase epitaxy method for growing the transparent layer onto a LED grown structure.

2. Description of the Prior Art

In recent years, The Light-Emitting Diode (LED) has become more and more popular. The LED has a semiconductor light generation region situated on a light absorbing substrate. The popularity with LED's is beginning to replace incandescent lamps. In order to meet the demands for light output, it is important that the overall light output efficiency of the LED be maximized. In this manner, the transparent layer plays an important role in a LED device.

In the prior art, one well-known method for growing the transparent layer in a LED device is formed by metal-organic chemical vapor deposition (MOCVD). However, there are many disadvantages in MOCVD. First, MOCVD causes a problem with environmental pollution, because the MOCVD vapor is poisonous. Furthermore, if the desired transparent layer comprises GaP or the like, there is still another safety problem with a possible explosion and spontaneous combustion of the phosphorous compound. Second, MOCVD is not an efficient method for growing the transparent layer. For example, in the case of growing a transparent layer of GaP, the growing rate is about 10 $\mu$m per hour.

Another well-known method for growing the desired transparent layer is liquid phase epitaxy (LPE). In the conventional LPE process, there are still many shortcomings and limits. A serious problem of the conventional LPE process is a melt back effect occurring in the LED top layer during the growing of the transparent layer onto the LED grown structure. The above-noted "melt back" will crack the construction of the LED device. Moreover, the uppermost layer of the LED grown structure, where the transparent layer is grown, is limited. For example, while growing a GaP onto the LED grown structure, the uppermost layer of the LED grown structure must be a lattice-matched and thick-enough layer of GaP.

Hence, it is an important object of developing an improved method for growing the transparent layer of a LED device more efficiently and optimizing the above-mentioned transparent layer.

SUMMARY OF THE INVENTION

In accordance with the present invention, a transparent layer of a LED structure is provided, wherein the transparent layer comprises semiconductor material, and zinc (Zn) and/or magnesium (Mg) as a dopant.

It is another object of this invention to provide a method for growing a transparent layer of a LED structure. An improved LPE process is utilized in this present invention, thus the transparent layer can be formed more efficiently.

Still another object of this invention is to provide an improved LPE process for forming a transparent layer of a LED structure. A different solvent is employed in the above-mentioned LPE process, and the shortcomings in the prior art, such as the melt back effect in the LED grown structure during the growing of the transparent layer, and so on, can be overcome.

Still another object of this invention is to provide an improved LPE process for forming a transparent layer of a LED structure. A dopant is employed in the improved LPE process, and thus the surface of the desired transparent layer is smoother than the surface of the transparent layer without the above-noted dopant.

Still another object of this invention is to provide an improved LPE process for forming a transparent layer of a LED structure. A dopant is employed in the improved LPE process, and thus the characters of the desired transparent layer, such as the forward voltage, and so on, can be improved.

In accordance with the above-mentioned objects, the invention provides structure of a transparent layer of a LED device and the method for growing the same. The transparent layer is formed by an improved LPE process. The above-mentioned LPE process comprises the following steps: providing a supersaturated solution comprising Sb as a solvent, immersing a LED grown structure into the supersaturated solution, and growing a transparent layer onto the LED grown structure. Additionally, in order to smooth the surface of the transparent layer and improve the characters of the transparent layer, a special dopant is added into the supersaturated solution. Therefore, the improved LPE process according to this invention can improve the quality of the transparent layer, and the transparent layer can be formed efficiently.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

One preferred embodiment of this invention is a method for growing a transparent layer onto a light-emitting diode (LED) device. A liquid phase epitaxy (LPE) process is utilized in the above-mentioned method. A supersaturated solution is prepared for the LPE process, wherein the supersaturated solution comprises antimony (Sb) as a solvent. A LED grown structure is then immersed into the supersaturated solution and a transparent layer is grown onto the surface of the LED device.

Figure 1:
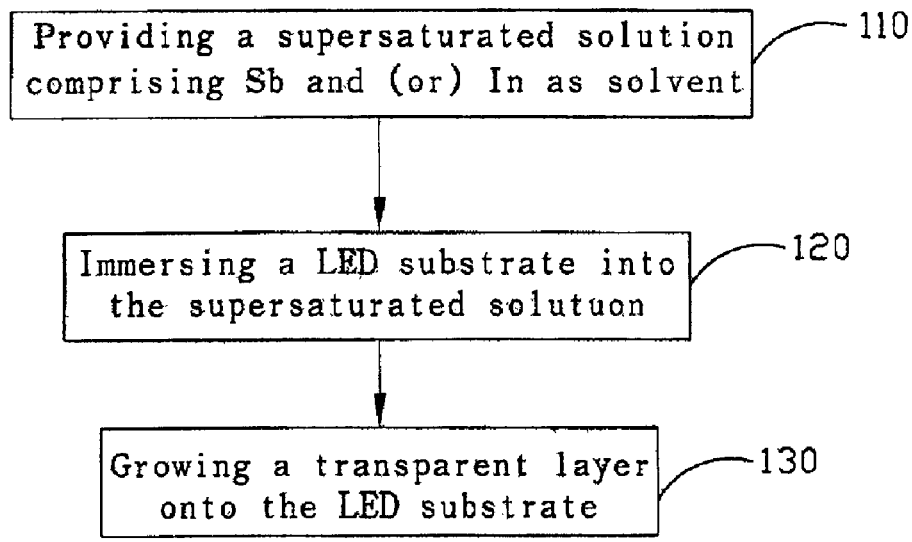
FIG. 1 is a diagram showing a flow chart for growing a transparent layer according to this invention.

In this preferred embodiment, the LPE process comprises the steps as shown in FIG. 1. First, a compound is solved into metallic antimony (Sb) and/or indium (In) to form a supersaturated solution, as the step 110. The compound may be a semiconductor material, such as GaP, GaAs, InP, or the mixture of semiconductor materials. As the step 120 shown in FIG. 1, a LED grown structure is immersed into the supersaturated solution. The LED grown structure comprises the layers of light generate region, bottom metal contact, and so on. Because the ) above-mentioned layers in the LED are not the key aspects of this invention, the layers will not be described in this application. Finally, the supersaturated solution is cooled down and a transparent layer consisting of the compound in the supersaturated solution, such as GaP, is grown onto the surface of the LED grown structure, as shown in the step 130. On the other hand, if the above-mentioned supersaturated solution comprises the indium compound, the growth rate of the transparent layer will be raised.

In this manner, the LPE process disclosed in this application overcomes the shortcomings in the prior art. In contrast to the LPE process in the prior art, the LPE process in this invention employed antimony (Sb), or indium (In), or Sb and In, as a solvent instead of gallium (Ga) in the prior art for growing the transparent layer. Therefore, the LPE process according to this present invention can prevent the melt back effect in the prior art. Moreover, the LPE process in the prior art, the uppermost layer of the LED grown structure must be GaP, if the solute in the supersaturated solution is GaP. However, in this present invention, the material of the uppermost layer of the LED grown structure is not limited. The comparison between the LPE process in the prior art and the improved LPE process according to this invention is set forth in Table 1.

TABLE 1

Comparison of the LPE process in the prior art and the LPE process according to this invention*

| Method | Solvent | Dopant | Uppermost layer of the LED grown structure | Occurring "melt back" | Improve growth rate |
|---|---|---|---|---|---|
| Prior art | Ga | None or Mg | GaP | Yes | No |
| Invention | Sb | Zn + Mg | GaP | no | No |
| Invention | Sb + In | Zn + Mg | No-limited (GaP:In) | no | Yes |

*While the desired transparent layer consists GaP.

On the other hand, the LPE process, according with this invention can overcome the defects of the MOCVD process in the prior art. For example, MOCVD process can cause a poisonous pollution. Additionally, when the MOCVD process is employed to grow a transparent layer of GaP, a safety problem in the MOCVD process is due to the possibility of explosion and spontaneous combustion of the phosphorus compound. Conversely, the LPE process in this invention can avoid the above-noted problems. Furthermore, the LPE in this invention is more efficient than the MOCVD process. In the view of growing a transparent layer of GaP, the MOCVD process spends 2 hours for growing a 20 $\mu$m transparent layer of GaP. However, a 20 $\mu$m transparent layer of GaP formed with the LPE process according to this invention just needs 20 minutes. Therefore, the method in according with this invention is not only more efficient than the MOCVD process, but can also bring the cost down in manufacturing a LED device. The comparison between the MOCVD and the LPE according to this invention is described in Table 2.

TABLE 2

Comparison between the MOCVD and the LPE process according to this invention

| Method | Toxic pollution | Explosion* | Growing rate (20 $\mu$m)* | Economic benefits of stepwise growing |
|---|---|---|---|---|
| MOCVD | Yes | Yes | 2 hours | No |
| LPE | No | No | 20 minutes | Yes |

*While the desired transparent layer is consisted of GaP.

In addition, in order to raise the character of the transparent layer, some dopants are usually utilized in the supersaturated solution of the LPE process. Conventionally, metallic magnesium (Mg) is employed as the dopant in the supersaturated solution. In this present invention, metallic zinc (Zn) or Mg may be added into the above-mentioned supersaturated solution as the dopant. After employing Zn as the dopant, the surface of the transparent layer becomes smoother. Preferably, it has been observed and proofed that if the more Zn dopant utilized in the supersaturated solution, the surface of the transparent layer is smoother. The amount of the Zn dopant added in the supersaturated solution is above $3\times10^{18}$ cm$^{-3}$.

For example, in the case of growing a transparent layer of GaP, Zn is doped in the supersaturated solution comprising metallic Sb as a solvent and GaP as a solute. The surface of the GaP transparent layer with Zn as the dopant is smoother than the surface of the GaP transparent layer without Zn. From the result of the experience, the Zn dopant is in an amount of $\frac{1}{1000}$ to $\frac{1}{10}$ by weight of the antimony in the supersaturated solution. Moreover, during an examination of the GaP transparent layer with Zn as the dopant, the Diode Forward Voltage (VF) is lowered from about >2.5 V to <2.4 V, and the intensity of the GaP transparent layer will raise from 18.62 to about 22~24 Mcd. Preferably, the Zn dopant can be utilized in other solvents of the LPE process. When metallic Zn is employed as the dopant in other supersaturated solutions, such as a supersaturated solution comprising Ga as a solvent, the surface of the layers formed by LPE process can also be smoother than the layers without the Zn dopant.

Figure 2:
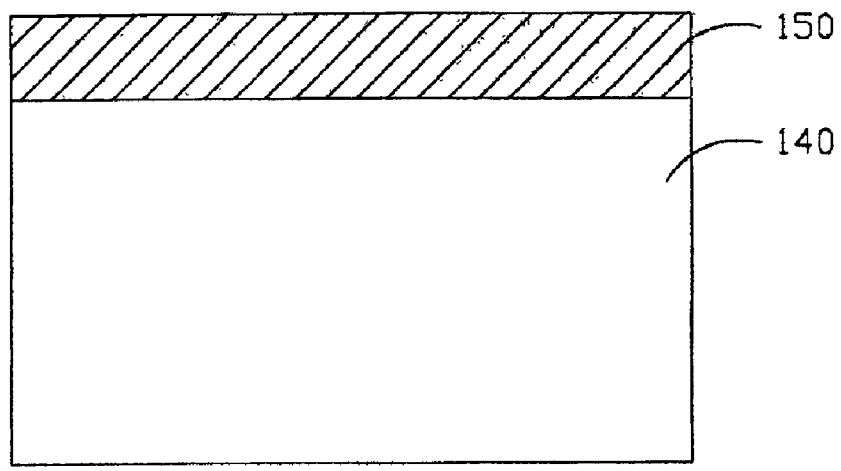
FIG. 2 is a schematic diagram showing a LED structure according to this present invention.

Another preferred embodiment of this present invention is about a structure of a LED device. Referred to FIG. 2, the LED structure according with this present invention comprises a LED grown structure 140 and a transparent layer 150. Because the layers in the LED grown structure 140, such as light generation region, bottom metal contact and so on, are not the point of this invention, the above-mentioned layers are not described in this application. The key aspect of this preferred embodiment is about the transparent layer 150. The transparent layer is made of a semiconductor material and a dopant. The above-noted semiconductor material comprises GaP, GaAs , InP, and so on. The semiconductor material also may be the mixture of at least two semiconductor materials. The dopant is metallic Zinc, metallic magnesium, or both of zinc and magnesium. The transparent layer 150 is formed by LPE process. A supersaturated solution utilized in the above-mentioned LPE process comprises metallic antimony (Sb), or indium (In), or Sb and In, as a solvent, and metallic zinc (Zn), or zinc and magnesium, as a dopant. In the example of growing a GaP transparent layer onto a LED grown structure, the supersaturated solution in the LPE process comprises metallic Sb as a solvent, GaP as a solute, and Zn or Mg as a dopant. The amount of the dopant Zn is from $\frac{1}{1000}$ to $\frac{1}{10}$ by weight of Sb. The above-mentioned LPE process can prevent the melt back effect from occurring at the uppermost layer of the LED grown structure 140 during the growing of the transparent layer.

Moreover, by utilizing the LPE process according to this invention, the transparent layer 150 can be formed efficiently. In the example of growing a GaP transparent layer by the LPE process, the growing rate of the transparent layer is >0.5 $\mu$m per minute. Additionally, because of Zn doped in the supersaturated solution, the surface of the transparent layer 150 will be smoother than the surface of the transparent layer without Zn dopant. The Zn dopant can improve the characters of the transparent layer 150, for example, from the result of the examination of the LED device, the Diode Forward Voltage (VF) is lowered from about >2.5 V to <2.4 V, and the intensity of the GaP transparent layer is raised from 18.62 to about 22~24 Mcd.

In addition, in order to prevent the construction of the LED grown structure broken down during the growing of the transparent layer 150 under the temperature about 500° C. ~1000° C., the growing process of the transparent layer can be performed in turn. For example, in the case of growing 20 $\mu$m transparent layer, the LED grown structure 140 is immersed into the supersaturated solution to perform the first growing process of the transparent layer to obtain a first 10 $\mu$m transparent layer, and then the LED structure 140 with the first 10 $\mu$m transparent layer is suffered to the secondary growing process of the transparent layer to obtain a secondary 10 $\mu$m transparent layer. In this manner, the desired 20 $\mu$m transparent layer 150 is grown onto the LED grown structure 140, and the LED grown structure 140 will not be broken down under the high temperature. Moreover, because the growing rate of the LPE process according to this invention is fast, it is still efficient for growing the transparent layer stepwise.

According to the preferred embodiment, this invention discloses a structure of a transparent layer of a LED device and the method for growing the same. The transparent layer is formed by an improved LPE process. The supersaturated solution utilized in the LPE process comprises antimony, and/or indium, as a solvent, and zinc, or zinc and magnesium, as dopant. Therefore, the above-mentioned method can overcome the problems, such as the melt back effect during the growing of the transparent layer, and efficiently form the transparent layer. Moreover, In is added together with Antimony as solvent to avoid the melt back effect to improve the growth rate of the transparent layer grown by LPE process. On the other hand, because of the Zn dopant, the method according to this present invention can not only advance the characters of the transparent layer, but also smooth the surface of the transparent layer. Thus, this invention discloses a more efficient method for growing a transparent layer onto a LED grown structure, and thus the quality of the transparent layer formed by this present invention can be improved. process. The supersaturated solution utilized in the LPE process comprises antimony, and/or indium, as a solvent, and zinc, or zinc and magnesium, as dopant. Therefore, the above-mentioned method can overcome the problems, such as the melt back effect during the growing of the transparent layer, and efficiently form the transparent layer. Moreover, In is added together with Antimony as solvent to avoid the melt back effect to improve the growth rate of the transparent layer grown by LPE process. On the other hand, because of the Zn dopant, the method according to this present invention can not only advance the characters of the transparent layer, but also smooth the surface of the transparent layer. Thus, this invention discloses a more efficient method for growing a transparent layer onto a LED substrate, and thus the quality of the transparent layer formed by this present invention can be improved.

Although specific embodiments have been illustrated and described, it will be obvious to those skilled in the art that various modifications may be made without departing from what is intended, but not to be limited solely by the appended claims.

What is claimed is:

1. A method for growing a transparent layer on a LED grown structure, comprising:

providing a supersaturated solution, wherein said supersaturated solution comprises Sb as a solvent;

immersing the LED grown structure into said supersaturated solution; and growing the transparent layer onto the LED grown structure.

2. The method according to claim 1, wherein said supersaturated solution further comprises a metallic dopant.

3. The method according to claim 2, wherein said metallic dopant comprises Zn.

4. The method according claim 3, wherein said Zn is in an amount of $\frac{1}{1000}$ to $\frac{1}{10}$ by weight of the Sb.

5. The method according to claim 1, wherein said step of immersing the LED grown structure into said supersaturated solution is performed under a temperature of about 500° C. to 1000° C.

6. A method for growing a transparent layer onto a LED grown structure, comprising:

providing a supersaturated solution, wherein said supersaturated solution comprises Sb as a solvent;

immersing the LED grown structure into said supersaturated solution;

growing a first transparent layer onto the LED grown structure, wherein the first transparent layer has a first thickness;

immersing the LED grown structure with the first transparent layer into said supersaturated solution; and growing a secondary transparent layer onto the first transparent layer on the LED grown structure, wherein the secondary transparent layer has a secondary thickness.

7. The method according to claim 6, wherein said supersaturated solution further comprises a metallic dopant.

8. The structure according to claim 7, wherein said metallic dopant comprises Zn.

9. The method according to claim 8, wherein said Zn is in an amount of $\frac{1}{1000}$ to $\frac{1}{10}$ by weight of the Sb.

10. The method according to claim 6, wherein said step of immersing the LED grown structure into said supersaturated solution is performed under a temperature of about 500° C. to 1000° C.

11. A method for growing a transparent layer onto a LED grown structure, comprising:

providing a supersaturating solution, wherein said supersaturating solution comprises Sb and In as a solvent, GaP as a solute, and Zn as a dopant;

immersing the LED grown structure into said supersaturated solution; and growing the transparent layer onto the LED grown structure.

12. The method according to claim 11, wherein said Zn is in an amount of $\frac{1}{1000}$ to $\frac{1}{10}$ by weight of Sb of the supersaturated solution in the LPE process.

13. The method according to claim 11, wherein said step of immersing the LED grown structure into said supersaturated solution is performed under a temperature of about 500° C. to 1000° C.

14. The method according to claim 11, wherein said growing the transparent layer comprises the following steps:
   growing a first transparent layer onto the LED grown structure;
   immersing the LED grown structure with said first transparent layer into said supersaturated solution; and
   growing a secondary transparent layer onto said first transparent layer.

15. A method for growing a transparent layer on a LED grown structure, comprising:
   providing a supersaturated solution, wherein said supersaturated solution comprises In as a solvent;
   immersing the LED grown structure into said supersaturated solution; and
   growing the transparent layer onto the LED grown structure.

16. A method for growing a transparent layer on a LED grown structure, comprising:
   providing a supersaturated solution, wherein said supersaturated solution comprises Sb and In as a solvent;
   immersing the LED grown structure into said supersaturated solution; and
   growing the transparent layer onto the LED grown structure.

17. A method for growing a transparent layer onto a LED grown structure, comprising:
   providing a supersaturated solution, wherein said supersaturated solution comprises In as a solvent;
   immersing the LED grown structure into said supersaturated solution;
   growing a first transparent layer onto the LED grown structure, wherein the first transparent layer has a first thickness;
   immersing the LED grown structure with the first transparent layer into said supersaturated solution; and
   growing a secondary transparent layer onto the first transparent layer on the LED grown structure, wherein the secondary transparent layer has a secondary thickness.

18. A method for growing a transparent layer onto a LED grown structure, comprising:
   providing a supersaturated solution, wherein said supersaturated solution comprises Sb and In as a solvent;
   immersing the LED grown structure into said supersaturated solution;
   growing a first transparent layer onto the LED grown structure, wherein the first transparent layer has a first thickness;
   immersing the LED grown structure with the first transparent layer into said supersaturated solution; and
   growing a secondary transparent layer onto the first transparent layer on the LED grown structure, wherein the secondary transparent layer has a secondary thickness.

* * * * *